(12) United States Patent
Raimann et al.

(10) Patent No.: US 12,309,981 B2
(45) Date of Patent: May 20, 2025

(54) POWER ELECTRONICS MODULE

(71) Applicant: ZF Friedrichshafen AG, Friedrichshafen (DE)

(72) Inventors: Manuel Raimann, Salem (DE); Pengshuai Wang, Eriskirch (DE)

(73) Assignee: ZF Friedrichshafen AG, Friedrichshafen (DE)

(*) Notice: Subject to any disclaimer, the term of this patent is extended or adjusted under 35 U.S.C. 154(b) by 133 days.

(21) Appl. No.: 18/355,182

(22) Filed: Jul. 19, 2023

(65) Prior Publication Data
US 2024/0032260 A1   Jan. 25, 2024

(30) Foreign Application Priority Data
Jul. 21, 2022   (DE) .................. 102022207435.1

(51) Int. Cl.
*H05K 7/20*   (2006.01)
*B60L 50/70*   (2019.01)
(Continued)

(52) U.S. Cl.
CPC .............. *H05K 7/209* (2013.01); *B60L 50/70* (2019.02); *H01L 23/367* (2013.01);
(Continued)

(58) Field of Classification Search
CPC .. H05K 7/02; H05K 7/14322; H05K 7/20509; H05K 7/209; H05K 1/0201; H05K 5/064; H01L 21/56; H01L 23/31; H01L 23/36; H01L 23/367; H01L 23/3677; H01L 23/3735; H01L 23/3737; H01L 23/473; H01L 23/49562; H01L 23/49811; H01L 23/49838; H01L 23/49861; H01L 23/5389; H01L 25/072; H01L 2224/73221; H01L 2224/37012; H01L 2224/40225; H01L 2924/1203; H02M 3/28; H02M 7/003

See application file for complete search history.

(56) References Cited

U.S. PATENT DOCUMENTS 10,128,166 B2 * 11/2018 Hori ................... H01L 25/18
10,893,602 B2 *  1/2021 Hunka ............. H05K 7/20854
(Continued)

FOREIGN PATENT DOCUMENTS

EP      3 499 560 A1   6/2019

OTHER PUBLICATIONS

Office Action dated Mar. 13, 2023 for German Patent Application No. 10 2022 207 435.1 (14 pp.), note: pp. 1 and 2 are English language Explanations to Section C. Result of Determination Document.

*Primary Examiner* — Amir A Jalali
(74) *Attorney, Agent, or Firm* — Crowell & Moring LLP

(57) ABSTRACT

A power electronics module includes a printed circuit board populated with numerous components of the power electronics module. Power semiconductors and DC and AC connecting elements are either placed adjacently to one another on an organic insulator, and each thermally and mechanically connected to a heat sink through the organic insulator, or the DC and AC connecting elements are placed between the power semiconductors and the heat sink and are thermally and mechanically connected to the heat sink and to the power semiconductors.

13 Claims, 2 Drawing Sheets

(51) Int. Cl.
*H01L 23/367* (2006.01)
*H01L 23/498* (2006.01)
*H02M 3/28* (2006.01)

(52) U.S. Cl.
CPC .. *H01L 23/49811* (2013.01); *H01L 23/49838* (2013.01); *H01L 23/49861* (2013.01); *H02M 3/28* (2013.01)

(56) References Cited

U.S. PATENT DOCUMENTS

| | | | |
|---|---|---|---|
| 2005/0035434 A1* | 2/2005 | Fissore | H01L 25/072 257/E25.016 |
| 2009/0194869 A1* | 8/2009 | Eom | H01L 23/3675 257/E23.101 |
| 2017/0236774 A1* | 8/2017 | Fushie | H01L 23/49861 257/675 |
| 2019/0189553 A1* | 6/2019 | Hohlfeld | H01L 25/072 |
| 2020/0052573 A1* | 2/2020 | Masuhara | H01L 23/40 |
| 2021/0398958 A1* | 12/2021 | Salvatore | H02H 3/02 |
| 2022/0070996 A1* | 3/2022 | Esler | H05K 7/20509 |
| 2022/0115284 A1* | 4/2022 | Nishimura | H05K 3/284 |
| 2022/0230891 A1* | 7/2022 | Fedi | H01L 23/49822 |
| 2024/0258196 A1* | 8/2024 | Woo | H01L 24/33 |

* cited by examiner

POWER ELECTRONICS MODULE

CROSS-REFERENCE TO RELATED APPLICATION

This application claims priority to German Application No. DE 10 2022 207 435.1, filed on Jul. 21, 2022, the entirety of which is hereby fully incorporated by reference herein.

FIELD

The present invention relates to the field of electric vehicles, in particular the electronics module for an electric drive powered by fuel cells.

BACKGROUND AND SUMMARY

Electronics modules, specifically power electronics modules, have been used to an increasing extent in motor vehicles over the last decades. This is partially due to the necessity of conserving fuel and improving vehicle performance, as well as to the progress made in semiconductor technologies.

The bridge circuits (forming half bridges) with which the electricity is provided are composed of numerous electronic components such as semiconductor power switches, also known as power semiconductors. Power semiconductors can be incorporated in power modules or used as discrete components. The disadvantages with power modules is that they are usually relatively large and therefore difficult to scale, and depending on their structure, only allow for relatively slow switching speeds. The disadvantages with using them as discrete components is that they have a relatively low thermal performance level compared to power modules.

An object of the invention is therefore to create a power electronics module with which a better thermal performance level can be obtained.

This problem is solved by the features in the independent claims. Advantageous embodiments form the subject matter of the dependent claims.

A power electronics module is proposed that contains a printed circuit board populated with numerous components that make up the power electronics module, many of which are formed by discrete power semiconductors, which have a housing, one side of which is thermally connected to an upper surface of a heat sink, another side of which is attached to the printed circuit board to obtain electrical contact. There is also a heat sink opposite the first side of the power semiconductor, the upper surface of which is thermally connected to the first side of each power semiconductor, and there are electrically conductive DC and AC connecting elements with which electrical contact to the power semiconductors is obtained. In a first case (A), there is an insulated metal substrate between the power semiconductors and the heat sink, comprising a metal core, an insulating layer, and a metal layer, wherein the metal layer on this insulated metal substrate is connected to the heat sink and the metal core is connected to the power semiconductors and structured such that it functions as the DC and AC connecting elements for obtaining electrical contact with the power semiconductors. In a second case (B), there is an organic insulating layer on the upper surface of the heat sink, on which a metallic conductor in the form of a lead frame is placed, which is structured such that it functions as the DC and AC connecting elements for obtaining electrical contact with the power semiconductors. In a first sub-case (B1), the power semiconductors and DC and AC connecting elements are placed on the organic insulator next to one another, such that they are thermally and mechanically connected to the heat sink through the organic insulator. In a second sub-case (B2), the DC and AC connecting elements are in between the power semiconductors and the heat sink such that they are thermally and mechanically connected to the heat sink, and thermally and electrically connected to the power semiconductors.

In one embodiment, the surface area of the DC and AC connecting elements when they are located between the power semiconductors and the heat sink is larger than the surface area of the power semiconductors placed thereon.

In one embodiment, the metal core or the lead frame is structured such that a part thereof forms the ground connection.

In one embodiment, the metal core in the first case (A) is structured such that a trough is formed between the DC and AC connecting elements that is deep enough to reach the insulating layer.

In one embodiment, the electrical and/or mechanical connection is a soldered or sintered connection.

In one embodiment, the thermal contact via the housing for the power semiconductors is formed by a surface contact.

In one embodiment, the discrete semiconductors form semiconductor switches.

A power electronics module is also obtained that functions as a DC/DC converter, inverter, or charger unit.

In one embodiment, an electrically insulating compound is placed between the printed circuit board and the heat sink.

An inverter or DC/DC converter is also obtained that contains the power electronics module. An electric drive or fuel cell drive for a vehicle is also obtained that contains the inverter or DC/DC converter. A motor vehicle with an electric motor powered by an electric drive or fuel cell drive is also obtained.

The invention also relates to a method for producing the power electronics module, in which in a first step in the first case (A), the metal core in the insulated metal substrate is structured in advance, and in another step, the metal layer in the insulated metal substrate is connected to the heat sink, after which the discrete power semiconductors are connected to the insulated metal substrate. In the case (B1), the lead frame is produced in advance, and the organic insulating layer is placed on the heat sink in another step, after which the lead frame and the discrete power semiconductors are thermally and mechanically connected with the organic insulator to the heat sink through the application of pressure and heat, after which the discrete power semiconductors are electrically connected to the DC and AC connecting elements. In the case (B2), the lead frame is produced in advance, and the organic insulator is placed on the heat sink in another step, after which the lead frame is thermally and mechanically connected with the organic insulator to the heat sink through the application of pressure and heat. The discrete power semiconductors are then placed on the DC and AC connecting elements such that they are thermally and electrically connected. In a second step, the discrete power semiconductors and other components of the power electronics module come in electrical contact with the printed circuit board, and in a third step, the space between the printed circuit board and heat sink is filled with an electrically insulating compound.

Further features and advantages of the invention can be derived from the following descriptions of exemplary embodiments in reference to the drawings illustrating details of the invention, and from the claims. The individual features can be obtained in and of themselves or in various arbitrary combinations forming different variations of the invention.

Preferred embodiments of the invention shall be explained below in greater detail in reference to the drawings.

DETAILED DESCRIPTION

Figure 1:
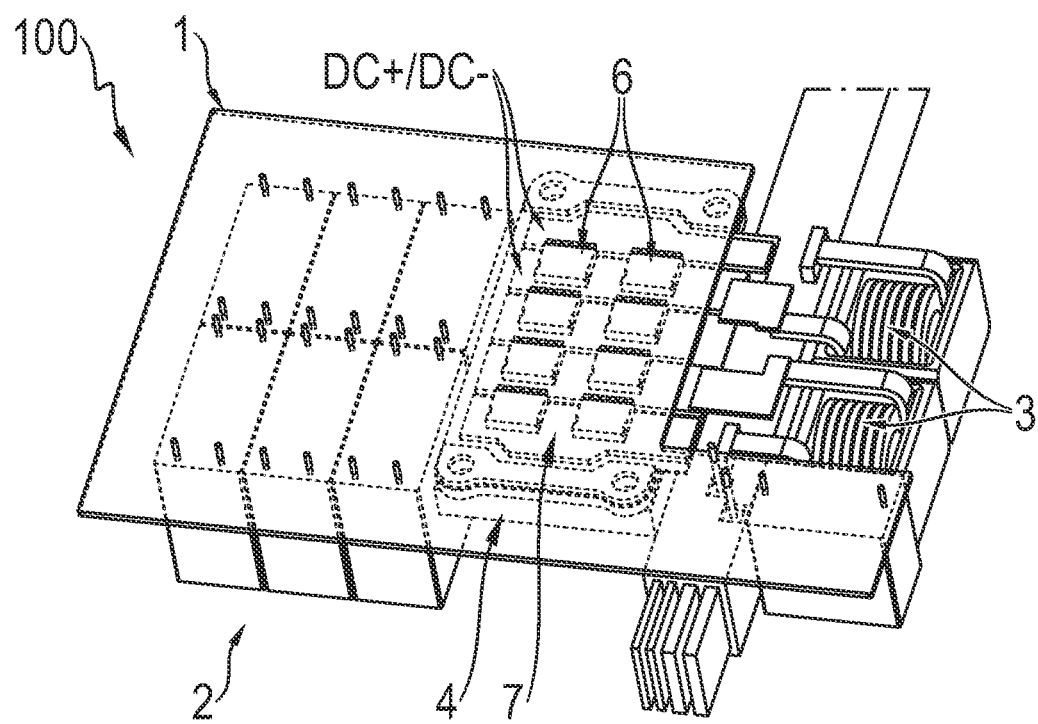
FIG. 1 shows a fundamental structure of a power electronics module according to one embodiment of the present invention.

Identical elements and functions have the same reference symbols in the following descriptions of the drawings.

As stated, one aim of the present disclosure is to obtain an improved thermal performance level for the power electronics module, i.e. an improved heat dissipation.

The embodiments described below display an ICP (integrated circuit packaging) concept that unites the advantages of power modules, in particular efficient cooling, and the advantages of discrete components, in particular good scalability and high switching speeds.

This concept involves the use of discrete power semiconductors 6 that can be contacted from both sides, which are connected to the heat sink 4 in the power electronics module 100 via the embodiments described in reference to the drawings.

Discrete power semiconductors 6, i.e. power semiconductors encased in a (standard) housing, that can be contacted from both sides have a design in which a metallic surface is applied to a flat surface 61 of the housing that can be brought into contact with a heat sink 4 for a more efficient cooling of the power semiconductors 6. There are pins on the opposite side 62 and/or one or more short sides 63 of the housing, with which electrical contact to the power semiconductors 6 can be obtained.

These discrete power semiconductors 6, simply referred to as power semiconductors 6 below, are normally semiconductor switches that form substantial components of a power electronics module 100.

The power electronics modules 100 proposed in this disclosure are used in the automotive field as DC/DC converters, inverters (DC/AC), chargers, etc. Some applications of the present disclosure are DC/DC converters that are used in the framework of a fuel cell drive for motor vehicles, in particular commercial vehicles.

A power electronics module 100 contains, as shown in FIG. 1, a printed circuit board 1 populated with numerous components, including a heat sink 4, control and contact elements, etc. for the power electronics module 100. There are also chokes 3 and safety capacitors 2 in the form of Y capacitors (interference suppression capacitors), and busbars for power distribution via AC and/or DC connecting elements DC+/DC−, AC. There are also numerous discrete (housed) power semiconductors 6 between the capacitors 2 and the busbars, which are connected to the printed circuit board 1. One side 61 of each of the housings for the discrete power semiconductors 6 can be connected thermally to an upper surface of the heat sink 4. This side 61 is advantageously a side of the housing with a large surface area that is coated with a corresponding, heat conducting material, e.g. metal, and which is connected over its surface area to the metal core 71 in an insulated metal substrate 7, or the organic insulator 9, or the lead frame 10 in the embodiments described below. Another side (side 62 in FIGS. 2-4) is electrically connected by its pins to the printed circuit board 1, e.g. through soldering or sintering. One or more of the other sides 63 can also have pins protruding from the housing for the power semiconductor 6, in order for the power semiconductors 6 to come in electrical contact with electrically conductive AC and/or DC connecting elements DC+/DC−, AC, depending on the shape of the housing.

The power electronics module 100 also has at least one heat sink 4 opposite the first side 61 of the power semiconductor 6, the upper surface of which is connected to or in contact with the first side 61 of each power semiconductor 6. The heat sink 4 absorbs heat discharged from the power semiconductors 6 in order to protect them against overheating.

The power semiconductors 6 are therefore always located between a printed circuit board 1 and a heat sink 4.

There are also electrically conductive DC connecting elements DC−, DC+ for supplying electricity, or electrically conductive AC connecting elements AC for obtaining electricity converted in the power semiconductors 6. These are in electrical contact with the power semiconductors 6 via their pins, for example.

The various proposed concepts for obtaining a better thermal connection and therefore more efficient cooling of the power semiconductors 6 shall be described below.

Figure 2:
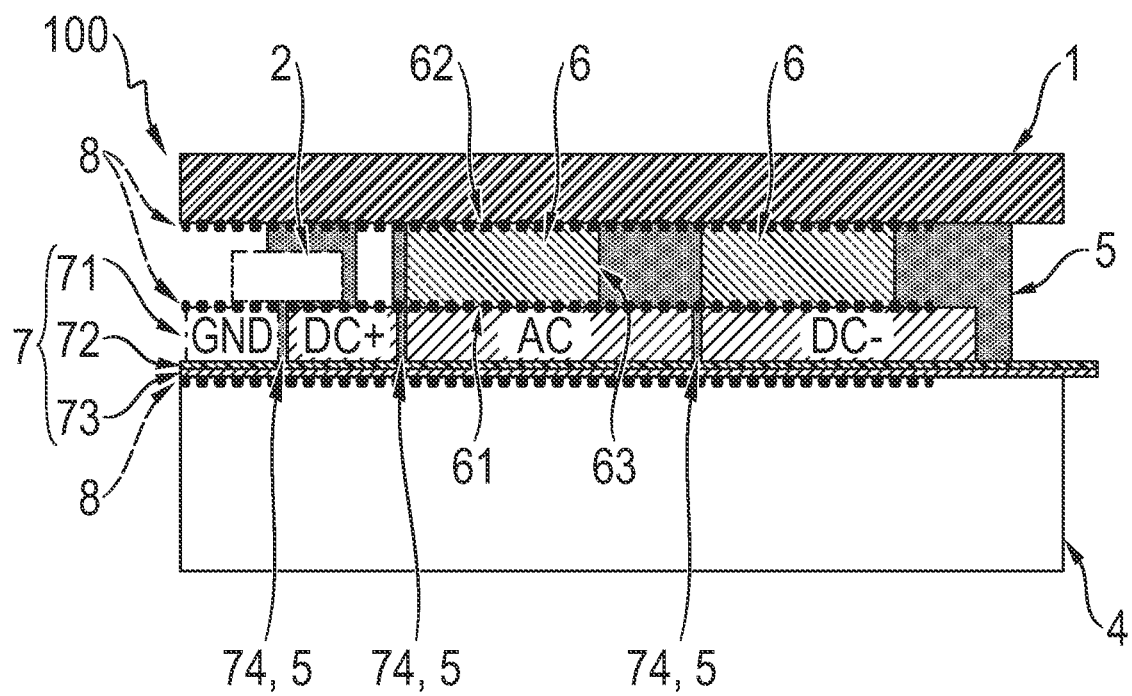
FIG. 2 shows a sectional view of the power electronics module in FIG. 1.

The first concept is illustrated in FIGS. 1 and 2, and is referred to as case (A). In this case (A), an insulated metal substrate 7, (IMS), is placed between the power semiconductors 6 and the heat sink 4. Insulated metal substrates 7 contain a metal core 71 and a metal layer 73 with an insulating layer 72 therebetween. As the sectional view in FIG. 2 shows, the insulated metal substrate 7 is between the power semiconductors 6 and the heat sink 4. The metal layer 73 is connected to the heat sink 4, and the metal core 71 is connected to the power semiconductors 6 in this orientation. The metal core 71 is structured such that it functions as DC and AC connecting elements DC−, DC+, AC for obtaining electrical contact to the power semiconductors 6. There are troughs 74 of a predefined width that are deep enough to reach the insulating layer 72 between the individual structures of the metal core 71 that function as DC− or DC+, or as AC connecting elements and are in electrical contact with the corresponding power source (e.g. fuel cell) or the corresponding load (AC is connected to the vehicle drive) and the power semiconductors 6, which electrically insulate the structures from one another. The width of the troughs 74 is determined by the person skilled in the art, depending on the application. The structures are formed in advance in the insulated metal substrate 7, during its production process. This makes it easier to obtain troughs with straight walls that are deep enough to reach the insulating layer 72.

As can be seen in FIG. 2, there are three connecting planes 8 in this case (A). One connecting plane 8 is between the printed circuit board 1 and the power semiconductors 6, connecting them to one another. Another connecting plane 8 is between the power semiconductors 6 and the metal core 71, thus connecting them to one another, and a third connecting plane 8 is between the metal layer 73 and the heat sink 4, such that it connects them to one another.

In one embodiment, the metal layer 73 can be structured or unstructured, depending on which option results in a better connection.

Figure 3:
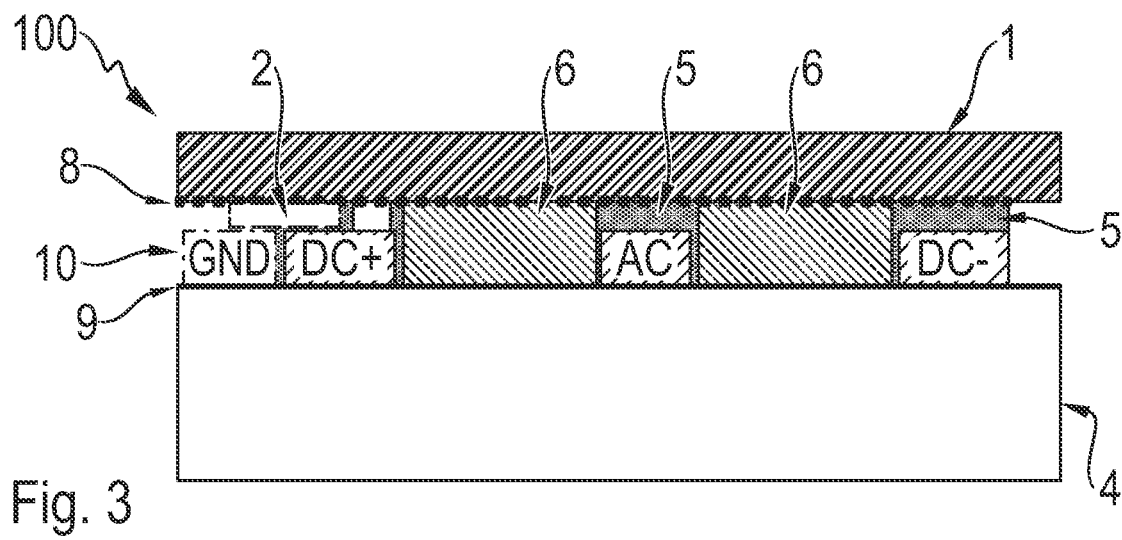
FIGS. 3 and 4 each show a sectional view of an alternative embodiment of the power electronics module in FIG. 1.
Figure 4:
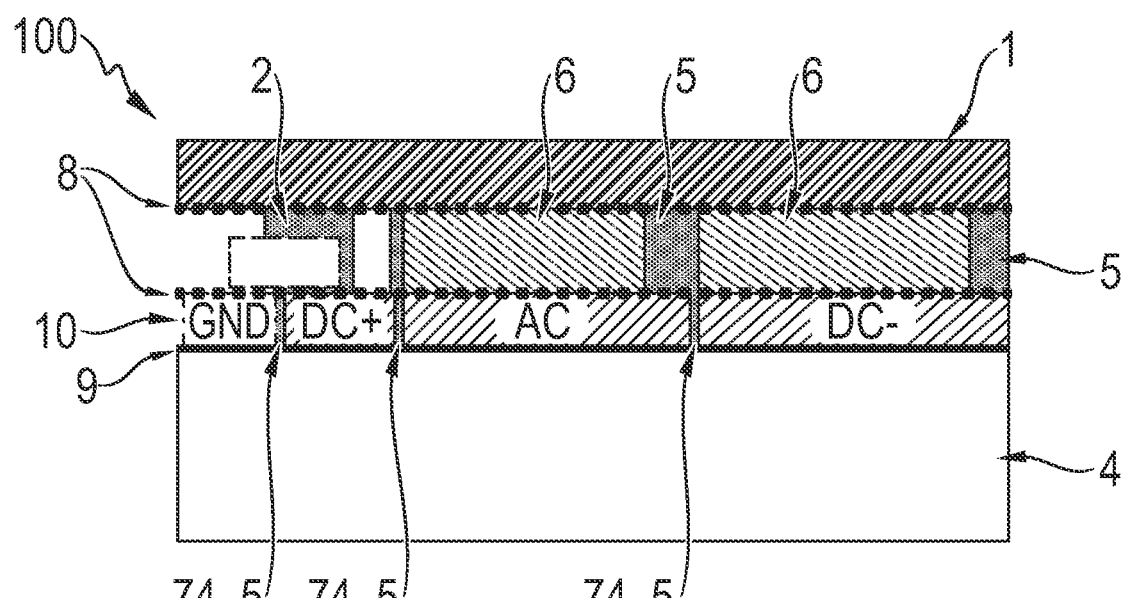

The second concept is shown in FIGS. 3 and 4, and referred to as case (B), which can be further subdivided into to sub-cases (B1) and (B2). In this case (B), there is a layer formed by an organic insulator 9 on the upper surface of the heat sink 4. A lead frame 10 is placed on the organic insulator 9, which is structured such that it functions as DC and AC connecting elements DC−, DC+, AC, for obtaining an electrical contact to the power semiconductors 6. The lead frame 10 has the same structure as the metal core 71 in the IMS 7, i.e. DC and AC connecting elements DC−, DC+, AC and a ground GND that are separated from one another by troughs.

In the first case (B1), the power semiconductors 6 and the DC and AC connecting elements DC−, DC+, AC are adjacent to one another on the organic insulator 9. The power conductors 6 and the DC and AC connecting elements DC−, DC+, AC are also each thermally and mechanically connected to the heat sink 4 via the organic insulator 9 through the application of pressure and heat. The power semiconductors 6 and the DC and AC connecting elements DC−, DC+, AC are connected electrically to one another, e.g. with pins on the power semiconductors 6. In this case (B1), the connecting plane is formed by a simple soldering or sintering plane, which is located between the printed circuit board 1 and the power semiconductors 6.

In the second case (B2), in differing from the first case (B1), the DC and AC connecting elements DC−, DC+, AC, i.e. the lead frame 10, are located between the power semiconductors 6 and the heat sink 4, and thermally and mechanically connected to the heat sink 4 via the organic insulator 9, and thermally and electrically connected to the power semiconductors 6. In this case (B2) there are two connecting planes 8 in the form of soldering or sintering planes, specifically between the printed circuit board 1 and the power semiconductors 6, and between the power semiconductors 6 and the lead frame 10. In this case, the massive structures of the DC and AC connecting elements DC−, DC+, AC, i.e. the lead frame 10, can be thermally and mechanically connected to the heat sink 4 through the application of pressure and heat, before contact is made to the more fragile power semiconductors 6.

In the embodiments shown in FIGS. 2 and 4 (Cases (A) and (B2)), it is advantageous when the surface area of the structures in the metal core 71 or lead frame 10 located below the power semiconductors 6 is larger than the surface area of the power semiconductors 6. This disperses the heat, such that it is distributed over the entire surface area of the structures of the metal core 71 or lead frame 10, i.e. the DC and AC connecting elements DC−, DC+, AC, under the power semiconductors 6. This surface can also be used as an electrical contact.

In all of the embodiments, other components (e.g. safety capacitors 2) come in contact with the printed circuit board 1 and/or the metal core 71 or lead frame 10 at the same time as, or after the placement of, the power semiconductors 6.

In all of the embodiments, the structures forming the DC and AC connecting elements DC−, DC+, AC can be made of an electrically conductive material such as metal, in particular copper.

In all of the embodiments, the connecting planes 8 can be soldering or sintering planes, and the different planes can also have different types of connections.

In all of the embodiments, other components can be connected to the DC and AC connecting elements DC−, DC+, AC, the printed circuit board 1 and the heat sink 4. Furthermore, parts of the metal core 71 in case (A) or the lead frame 10 in case (B) can form the ground GND, and come in contact with components.

In all of the embodiments, an electrically insulating compound can be placed between the printed circuit board 1 and the heat sink 4, which can also function to dissipate heat. Such a compound 5 fills all of the empty spaces, including the troughs 74, between the DC and AC connecting elements DC−, DC+, AC, the DC and AC connecting elements DC−, DC+, AC and the ground GND, and between the DC and AC connecting elements DC−, DC+, AC and the power semiconductors 6.

As a result of the proposed material bonded connection of the power semiconductors 6 to the heat sink 4 via the IMS 7, or the lead frame 10, a more efficient cooling of the power semiconductors 6 can be obtained.

Figure 5:
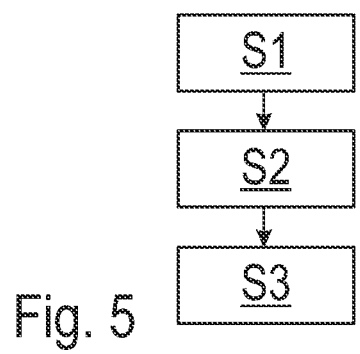
FIG. 5 shows a flow chart for producing the power electronics module according to all of the embodiments of the present invention.

FIG. 5 schematically illustrates the method for producing the power electronics module. In a first step S1, the metal core 71 in the insulated metal substrate 7; 71-73 is structured in advance, and the metal layer 73 in the insulated metal substrate 7; 71-73 is connected in another step to the heat sink 4, and the discrete power semiconductors 6 are subsequently connected to the insulated metal substrate 7; 71-73. In case (B1), the lead frame 10 is produced in advance, and the organic insulator 9 is place on the heat sink 4 in another step, and the lead frame 10 and the discrete power semiconductors 6 are thermally and mechanically connected with the organic insulator 9 to the heat sink 4 through the application of pressure and heat, after which the discrete power semiconductors 6 are electrically connected to the DC and AC connecting elements DC−, DC+, AC. In the case (B2), the lead frame 10 is produced in advance, and the organic insulator 9 is applied to the heat sink 4 in another step, and the lead frame 10 is subsequently thermally and mechanically connected with the organic insulator to the heat sink through the application of pressure and heat. The discrete power semiconductors 6 are then placed on the DC and AC connecting elements DC−, DC+, AC, and thus thermally and electrically connected.

In a second step S2, the discrete semiconductors 6 and other components 2 of the power electronics module 10 are brought into electrical contact with the printed circuit board 1, and in a third step S3, the spaces between the printed circuit board 1 and the heat sink 4 are filled with an electrically insulating compound 5.

An electronics module in the framework of the present disclosure is used to operate an electric motor for a motor vehicle powered by rechargeable fuel cells. The motor vehicle is a commercial vehicle in particular, e.g. a truck or a bus, or a passenger automobile. The power electronics module comprises a DC/AC inverter. It can also comprise an AC/DC rectifier, DC/DC converter, transformer, and/or another electrical converter or a part of such a converter, or a part thereof. In particular, the power electronics module is used to provide electricity to an electrical machine, e.g. an electric motor and/or a generator. A DC/AC inverter is preferably used to generate a multi-phase alternating current from a direct current generated by a DC voltage of a power source such as a battery. A DC/DC converter is used to convert a direct current from a fuel cell into a direct current for the drive (a boost converter), for example.

DC/DC converters and inverters for electric drives in vehicles, in particular passenger automobiles and commercial vehicles such as buses, are configured for high voltage ranges, and are configured in particular for a cut-off voltage class starting at ca. 650 volts.

LIST OF REFERENCE SYMBOLS 100 power electronics module
1 printed circuit board
2 capacitor, safety capacitor, Y capacitor
3 choke
4 heat sink
5 compound
DC+/DC− electrically conductive DC connecting elements
AC electrically conductive AC connecting elements
GND ground
6 discrete power semiconductor
61 first side
62 second side
63 third side
7 insulated metal substrate
71 first layer, metal core
72 second layer, insulating layer
73 third layer, metal layer
74 troughs in 71 between DC/AC
8 connecting plane (soldering, sintering, etc.)
9 organic insulator
10 lead frame

The invention claimed is:

1. A power electronics module, comprising:
a printed circuit board populated with a plurality of components of the power electronics module, at least some of which form discrete power semiconductors each comprising a housing, wherein a first side of the housing is configured to thermally connect to an upper surface of a heat sink, and wherein another side of the housing are configured to be attached to the printed circuit board and brought into electrical contact;
the heat sink opposite the first side of the housings of the power semiconductors, the upper surface of which is thermally connected to a first side of each power semiconductor;
electrically conductive DC and AC connecting elements configured to obtain electric contact to the power semiconductors; and
an insulator located between the printed circuit board and the heat sink, wherein the insulator comprises an insulated metal substrate between the power semiconductors and the heat sink, wherein the insulated metal substrate comprises a metal core, an insulating layer, and a metal layer, wherein the insulated metal substrate is placed such that the metal layer is connected to the heat sink, and the metal core is connected to the power semiconductors, and is structured such that it functions as the DC and AC connecting elements.

2. The power electronics module according to claim 1, wherein a surface area of the DC and AC connecting elements is larger than a surface area of the power semiconductors placed thereon in the cases in which the DC and AC connecting elements are between the power semiconductors and the heat sink.

3. The power electronics module according to claim 1, wherein the metal core or the lead frame is structured such that a part thereof functions as a ground connection.

4. The power electronics module according to claim 1, wherein the metal core is structured such that there is a trough reaching to the insulating layer between the DC and AC connecting elements.

5. The power electronics module according to claim 1, wherein an electrical and/or mechanical connection is a soldered or sintered connection.

6. The power electronics module according to claim 1, wherein thermal contact by the housings of the power semiconductors is formed as a surface area contact.

7. The power electronics module according to claim 1, wherein the power semiconductors comprise semiconductor switches.

8. The power electronics module according to claim 1, wherein the power electronics module comprises a DC/DC converter, an inverter, or a charger.

9. The power electronics module according to claim 1, comprising:
an electrically insulating compound placed in spaces between the printed circuit board and the heat sink.

10. An inverter or DC/DC converter, comprising the power electronics module according to claim 1.

11. An electric drive or fuel cell drive for a motor vehicle, comprising the inverter or DC/DC converter according to claim 10.

12. The motor vehicle, comprising an electric motor driven by the electric drive or the fuel cell drive according to claim 11.

13. A method for producing a power electronics module, comprising:
structuring a metal core in an insulated metal substrate in advance, and connecting a metal layer in the insulated metal substrate to a heat sink, and subsequently connecting discrete power semiconductors to the insulated metal substrate, wherein the insulated metal substrate also includes an insulating layer;
bringing a plurality of discrete power semiconductors and other components of the power electronics module into electrical contact with a printed circuit board; and, wherein the discrete power semiconductors each comprise a housing;
thermally connecting a first side of the housing to an upper surface of the heat sink, and attaching another side of the housing to the printed circuit board and brought into electrical contact;
electrically connecting electrically conductive DC and AC connecting elements to the power semiconductors; and
locating the insulated metal substrate between the printed circuit board and the heat sink such that the metal layer is connected to the heat sink and the metal core is connected to the power semiconductors, and so that it functions as the DC and AC connecting elements.

* * * * *